United States Patent [19]

Wine

[11] 4,271,532

[45] Jun. 2, 1981

[54] RECEIVER WITH A CHANNEL SWAPPING APPARATUS

[75] Inventor: Charles M. Wine, Princeton, N.J.

[73] Assignee: RCA Corporation, New York, N.Y.

[21] Appl. No.: 93,229

[22] Filed: Nov. 13, 1979

[51] Int. Cl.³ .............................................. H04B 1/26
[52] U.S. Cl. .................................................. 455/186
[58] Field of Search ............... 455/186, 185, 179, 175, 455/169, 166, 154; 358/191, 192, 193

[56] References Cited

U.S. PATENT DOCUMENTS 3,953,801   4/1976   Podowski ............................ 455/186

OTHER PUBLICATIONS

Color TV Receiver Equipped with Microprocessor Control, By Wolfgang Baum, Funkschau 1977, Heft 17.
A System Approach to Low-Cost Electronic Tuning Address, By B. Howell, IEEE Transactions on Consumer Electronics, vol. CE-24, No. 3, Aug. 1978. pp. 408-416.

*Primary Examiner*—Robert L. Griffin
*Assistant Examiner*—Tommy P. Chin
*Attorney, Agent, or Firm*—Eugene M. Whitcare; Paul J. Rasmussen; Peter M. Emanuel

[57] ABSTRACT

A television tuning system includes apparatus for swapping or exchanging a presently selected channel for a previously saved channel when a user operates a switch provided for that purpose. The apparatus is arranged so that the saved channel is unaffected by channel selections so that it may be used by a user to quickly return to an originally selected channel after scanning other channels, e.g., during commercial interruptions, as well as to follow the progress of two programs, e.g., two sporting events on different channels.

6 Claims, 1 Drawing Figure

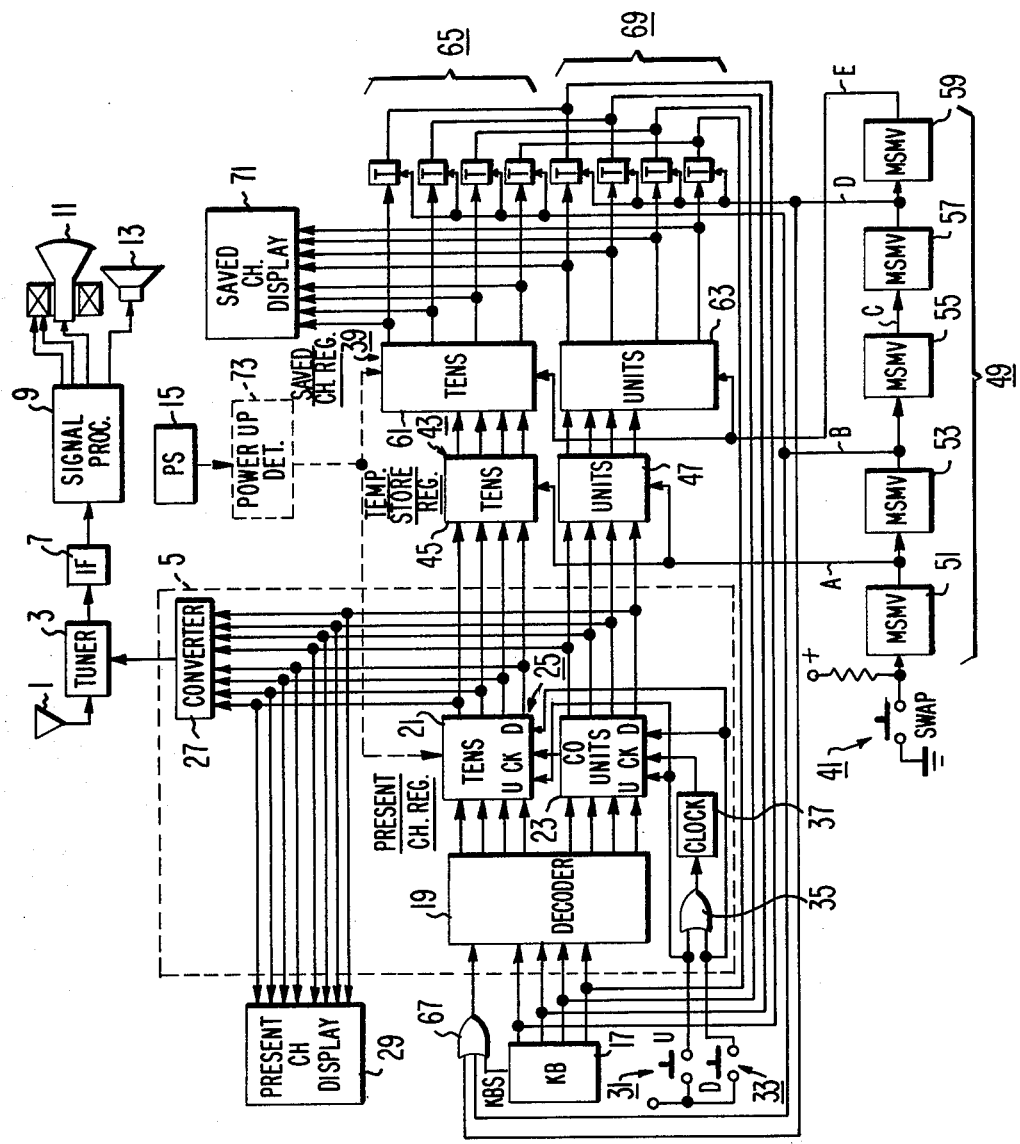

RECEIVER WITH A CHANNEL SWAPPING APPARATUS

BACKGROUND OF THE PRESENT INVENTION

The present invention relates to the field of channel selection on tuning apparatus for television and radio receivers. While the present invention is described with reference to a television receiver, it will be understood that it is also useful in a radio receiver.

Today there are a large number of television channels which users may select for viewing. For that reason, users may wish to examine what is on other channels after having selected a particular channel for viewing. For example, during commercial interruptions, users may wish to examine other channels to determine if there is something more interesting to watch than what is on the presently selected channel. In addition, sport enthusiasts may switch between two or more channels to watch the progress of two or more sporting events.

Channel selection systems with apparatus for swapping or exchanging two channels are known. A receiver with such swapping apparatus is disclosed in an article entitled "Farbfernsehgerat mit Mikroprozessor-Steuerung" by Wolfgang Baum appearing in German language magazine "Funkschau," 1977, Heft 17. In the disclosed receiver, the channel number of the channel last selected is automatically stored whenever a new channel is selected. When a control button is operated, the very last channel selected is again tuned. Since the channel last selected is automatically stored whenever a new channel is selected, the originally stored channel is lost whenever a new channel is selected. This limits the usefulness of this type of channel swapping apparatus. While such channel swapping apparatus is acceptable for switching between two channels, e.g., to follow the progress of two sporting events, it is not well suited for examining a large number of channels and then returning to an originally selected channel. In addition, such channel swapping apparatus is not well suited for use with channel selection systems of the indirect type by which channels can only be selected by depressing "up" and "down" scanning buttons which cause the channel number to be sequentially increased or decreased since it does not permit the exchange or swapping of non-consecutive channels.

SUMMARY OF THE PRESENT INVENTION

The present invention concerns a channel selection system for a television or radio receiver including user-actuated apparatus for swapping or exchanging a presently selected channel with a previously selected channel and thereafter storing information for tuning the channel that was originally selected for recall at any time, independent of intervening tuning selections. An embodiment of the present invention includes channel selection means for generating binary signals representing the channel numbers of various channels that may be selected by a user, present channel register means for storing binary signals representing the channel number of a presently selected channel, and saved channel register means for storing binary signals representing the channel number of a previously selected channel. Transfer means exchange the contents of the present channel register means and the saved channel register means in response to a swap signal generated when a user operates a switch provided for that purpose. The transfer means are arranged to prevent the contents of the present channel register means from being transferred to the saved channel register means when a new channel is selected so that the saved channel is preserved for later recall independent of intervening channel selections.

BRIEF DESCRIPTION OF THE DRAWING

The sole FIGURE is a schematic, partly in block form, of a television receiver employing the present invention.

DETAILED DESCRIPTION OF THE DRAWING

The television receiver shown in the sole FIGURE in an antenna 1 for applying RF carriers to a tuner 3. Tuner 3 is controlled in response to a tuning voltage generated by a tuning control system 5 to filter the particular RF signal associated with a selected channel from the received RF carriers. Tuner 3 is also controlled in response to the tuning voltage to generate a local oscillator signal having a predetermined frequency appropriate for tuning the selected channel. The selected RF carrier and local oscillator signal are heterodyned by tuner 3 to derive an IF carrier. The IF carrier is filtered and amplified by an IF section 7. The processed IF carrier has picture and sound signal components which are processed by signal processing circuits 9 to derive video drive and deflection signals for a picture tube 11 and an audio signal for speaker 13. A power supply 15 provides operating voltages for various portions of the receiver (the associated connections of which are not shown).

Channel selections may be made by a user by means of a calculator-like keyboard (KB) 17. KB 17 includes keys or pushbuttons for the digits 0 through 9. To select a particular channel, the user depresses the tens digit of the channel number and then the units digit. When a key is depressed, KB 17 generates a group of four binary signals encoded, e.g., in BCD (Binary Coded Decimal) format, to represent the respective digit. In addition, after a key has been depressed, KB 17 generates a keyboard strobe (KBS) signal signifying that the preceeding data is complete and may be further processed.

A decoder 19 responds to the binary signals representing each digit of the channel number and the two respective KBS signals to derive eight binary signals representing the complete channel number. The eight binary signals are partitioned into two groups of four binary signals representing in BCD format the tens and units digits, respectively, of the channel number. The binary signals representing the tens and units digits of the channel number of the presently selected channel are stored in tens and units registers 21 and 23, respectively, comprising together a present channel register 25.

A converter 27 converts the binary signals representing the channel number of the presently selected channel stored in present channel register 25 to the tuning voltage. Converter 27 may include any one of a number of well known arrangements, such as a phase locked loop, for converting binary signals representing a channel number into a corresponding tuning voltage. A display 29 displays the channel number of the presently selected channel in response to the binary signals stored in present channel number register 23. Present channel display 29 may comprise an array LED (Light Emitting Diode) or liquid crystal devices arranged to display numbers. It may alternately comprise an on-screen channel number display arrangement by which the channel number is displayed on a predetermined area of the picture produced by picture tube 11.

Present channel register 25 is arranged as an up-/down counter so that the channel to which the receiver is presently tuned may also be changed by operation of "up" (U) and "down" (D) scanning pushbuttons 31 and 33. For this purpose, register 21 and 23 are themselves up/down counters similar to, e.g., a type CD 4029 available from RCA Corporation, Somerville, N.J., and are coupled in cascade with the carry out (CO) of units register 23 coupled to the clock (CK) input of tens register 21. When U pushbutton 31 or D pushbutton 33 is depressed, a high logic level is applied to the respective one U and D control inputs of registers 21 and 23. This enables the contents of channel number register 25 to be changed in the selected sense. The high logic level generated when one of pushbuttons 31 and 33 is depressed is also applied through an OR gate 35 to a source of clock pulses 37 to cause the application of clock pulses to the CK input of units register 23. Thereafter, the contents of present channel register 23 are increased or decreased as long as the pushbutton is held depressed.

As is well known, circuitry (not shown) may be coupled to present channel register 25 for causing "illegal" channel numbers (i.e., channel numbers not corresponding to available channels, e.g., in the United States channels not between 2 and 83) to be skipped over as the contents of present channel number register 25 are increased or decreased. As is also well known, a memory arrangement (not shown) can be coupled to present channel memory 25 by which a user may preselect preferred channels and by which the "non-preferred" channels will be automatically skipped over as the contents of present channel number register 21 are increased or decreased.

A tuning control system of the same general type as tuning control system 5 with circuitry for changing the contents of a channel number register by means of either a keyboard or "up" and "down" pushbuttons and circuitry, including a phase locked loop, for converting the contents of the channel number register to a tuning voltage is disclosed in an article entitled "Frequency Synthesis Tuning Systems with Automatic Offset Tuning" by B. W. Beyers, et al, and an article entitled "Frequency Synthesis Custom LSI—The Inside Story" by H. Blatter, et al, appearing on pages 419-428 and 429-435 of the August 1978 edition of the IEEE *Transactions on Consumer Electronics*, Volume CE-24, Number 3, which is hereby incorporated by reference.

KB 17 is most useful for directly selecting a particular channel on which there is a desired program that is known about in advance. Up pushbutton 31 and down pushbutton 33 are most useful for rapidly scanning through the channels to determine if there is any desired program that is not known about in advance. Thus, KB 17 may be employed to first select a particular channel and, thereafter, up pushbutton 31 or down pushbutton 33 may be employed, e.g., during a commercial interruption, to examine what is available on other channels.

So that a user may conveniently recall the channel originally selected before a channel scanning procedure, the present arrangement includes a saved channel register 39 for storing the channel number of a previously selected channel and transfer apparatus for swapping or exchanging the contents of present channel register 25 and saved channel register 39 in response to the depression of a "swap" pushbutton 41. The transfer apparatus is arranged so that the contents of saved channel register 38 are not affected by changes to the contents of present channel register 25. This permits the recall of an originally selected channel independent of intervening channel selections.

The transfer apparatus includes a temporary storage register having a tens register 45 and a units register 47 for storing the binary signals presently stored in tens register 21 and units register 23 of present channel register 25, respectively. Registers 45 and 47 may comprise CD 4042 integrated circuits available from RCA Corporation. The contents of present channel register 25 are entered into and stored in temporary storage register 43 in response to a positive-going timing pulse A generated by a timing pulse generator 49. As shown, timing pulse generator 49 includes five cascaded monostable multivibrators (MSMV) 51–59. Timing pulse A is generated by MSMV 51 in response to the negative-going transition which occurs when swap pushbutton 41 is originally depressed. By the end of timing pulse A, the contents of present channel register 25 and temporary storage register 43 have been made the same. At this point in time, neither the contents of present channel register 25 or saved channel register 39 have been altered.

Saved channel register 39 includes a tens register 61 for storing binary signals representing the tens digit of the channel number of a previously selected channel and a units register 63 for storing binary signals representing the units digit of the channel number of the previously selected channel. Registers 61 and 63 may also comprise CD 4042 integrated circuits. The contents of tens register 61 and units register 63 of saved channel register 39 are sequentially applied to the four inputs of decoder 19 in response to timing pulses generated by timing pulse generator 49.

Specifically, a positive-going timing pulse B is generated by MSMV 53 in response to the negative-going transition at the end of timing pulse A. In response to timing pulse B, each of a group of normally non-conductive transmission (T) gates 65 are rendered conductive thereby applying the contents of tens register 61 to the four inputs of decoder 19. Timing pulse B is also applied to decoder 19 through an OR gate 67. Decoder 19 responds to the application of the contents of tens register 61 of saved channel register 39 and timing pulse B in the same manner as it responds to the digit representative binary signals and associated KBS signal generated by keyboard 17 when a user depresses the key corresponding to the tens digit of a channel number. As a result, by the end of timing pulse B, the contents of tens register 61 of saved channel register 39 have been transferred to tens register 21 of present channel register 25.

In response to the negative-going transition at the end of timing pulse B, MSMV 55 generates positive-going timing pulse C. In response to the negative-going transition at the end of timing pulse C, MSMV 57 generates a positive-going timing pulse D. In response to timing pulse D, each of a group of normally non-conductive transmission (T) gates 69 are rendered conductive thereby applying the contents of units register 63 of saved channel register 39 to the four inputs of decoder 19. In addition, timing pulse D is also applied to decoder 19 through OR gate 67. Decoder 19 responds to the application of the contents of units register 63 of saved channel register 39 and timing pulse D in the same manner as it responds to the digit representative binary signals and associated KBS signal generated by keyboard 17 when a user depresses the key corresponding to the units digit of the channel number of a channel. As a result, after timing pulse D, the contents of tens register 61 and units register 63 of saved channel register 39 have been transferred to tens register 21 and units register 23 of present channel register 25, respectively. The duration of timing pulse C is selected to be long enough, e.g., 30 milliseconds, to allow the processing of the contents of tens register 61 of saved channel register 39 by decoder 19 before the contents of units register 63 of saved channel register 39 are received by decoder 19.

In tuning arrangements of the type in which a large part may be incorporated into an integrated circuit, the arrangement of groups of transmission gates 65 and 69 for sequentially applying the contents of tens register 61 and units register 63 of saved channel register 39 to the four inputs of decoder 19 is particularly desirable since it saves four input terminals for the integrated circuit.

In response to the negative-going transition of timing pulse D, a positive-going timing pulse E is generated by MSMV 59. In response to timing pulse E the contents of temporary storage register 43 are entered and stored in saved channel register 39. Thus, by the end of timing pulse E, the contents of present channel register 25 and saved channel register 39 have been exchanged.

While the transfer apparatus of the present channel swapping apparatus allows viewers to exchange two channels, e.g., to follow the progress of two sporting events, it prevents the contents of saved channel register 39 from being affected by channel selections since temporary storage register 43 is only caused to transfer the contents of present channel register 25 to saved channel register 39 when a user depresses swap pushbutton 41. This latter feature allows users to examine other channels, e.g., during commercial interruptions, and then to quickly return to the originally selected channel by depressing swap pushbutton 41.

The operation of the present swapping arrangement, from the user's perspective, may be understood by reference to the following table which indicates, by example, its usage.

| USER ACTION | Contents of Present Channel Register | Contents of Saved Channel Register |
| --- | --- | --- |
| None | 02 | 04 |
| Select New Channel by Keyboard | 13 | 04 |
| Depress Swap Pushbutton | 04 | 13 |
| Select New Channel by Up Pushbutton | 05 | 13 |
| Select New Channel by Up Pushbutton | 06 | 13 |
| Select New Channel by Up Pushbutton | 07 | 13 |
| Depress Swap | 13 | 07 |

A saved channel display 71 is provided to display the channel number of the saved channel to facilitate the use of the above-described channel swapping apparatus. Saved channel display 71 may be a separate display of the same type as present channel display 29. Alternately, display 29 and display 71 may be the same display if multiplexing apparatus is provided to selectively apply the contents of present channel register 25 and saved channel register 39 to it.

It is desired that at least the portion(s) of power supply 15 which provides operating voltages to present channel register 25 and saved channel register 39 be kept operative even when the receiver is off so that the contents of these registers are maintained when the receiver is off. Alternately, registers 25 and 39 may be non-volatile registers, i.e., registers which maintain their contents in the absence of operating power. In the absence of provisions to maintain the contents of registers 25 and 39 when the receiver is off, a power up detector 73 may be provided to generate a power up signal for resetting the contents of registers 25 and 39 to represent predetermined channel numbers, e.g., the lowest channel number, when the receiver is turned on.

While the present channel swapping apparatus has been described in terms of a channel selection system in which channel selections may be made by both a keyboard and "up" and "down" scanning pushbuttons, it will be understood that only one of two channel selection means may be provided. In this respect, while the swapping apparatus disclosed in the aforementioned article by Wolfgang Baum does not permit the exchange of non-consecutive channels when employed with an "up" and "down" scanning type of channel selection system since in that apparatus the previously stored channel is automatically lost when a new channel is selected, the present swapping apparatus is not so limited and when employed with an "up" and "down" channel selection system is able to exchange non-consecutive channels as is indicated in the above table. Further, while present channel number register 25 and saved channel number register 39 have been disclosed as storing binary signals representing channel numbers in BCD format, other codes may be utilized. For that matter, the binary signals may represent information related to channels other than channel numbers, e.g., tuning voltages. Still further, while timing pulse generator 49 has been described as comprising MSMV 51–59, it will be appreciated that a counter arrangement may alternately be employed. Still further, the present invention may be implemented utilizing a microprocessor or microcomputer. In this case, registers of the central processing unit and random access memory may be used as present channel register 25, temporary storage register 43 and saved channel register 39. These, as well as other modifications to the present invention, are contemplated to be within the scope of the present invention as defined by the following claims.

What is claimed is:

1. In a receiver, tuning apparatus responsive to a tuning signal for tuning said receiver to channels selected by a user in response to a tuning signal, comprising:

channel selection means for generating groups of encoded binary signals corresponding to respective selected channels, said channel selection means including present channel register means for storing the encoded binary signals corresponding to a presently selected channel;

conversion means for converting binary signals stored in said present channel register means into said tuning signal for tuning said receiver to a selected channel;

saved channel register means for storing binary signals corresponding to a previously selected channel;

swap function means for generating a swap signal only when operated by a user;

transfer means for exchanging the contents of said present channel register means and said saved channel register means only in response to said swap signal whereby the contents of said saved channel register are not affected when a new channel is selected.

2. The apparatus recited in claim 1 wherein:

said present channel register means includes portions for storing respective groups of encoded binary signals representing respective digits of the channel number of a presently selected channel;

said channel selection means includes input means for sequentially generating groups of encoded binary signals representing the digits of the channel number of a newly selected channel and decoder means for applying said sequentially generated groups of encoded binary signals to respective portions of said present channel register;

said saved channel register means includes portions for storing respective groups of encoded binary signals representing respective digits of the channel number of a previously selected channel; and said transfer means includes transmission means for sequentially applying the groups of encoded binary signals stored in each one of said portions of said saved channel register means to said decoder means in response to said swap signal in the same order that said input means generates said groups of encoded binary signals representing the digits of the channel number of a newly selected channel.

3. The apparatus recited in claim 2 wherein said transfer means includes:

timing means for sequentially generating timing pulses in response to said swap signal;

temporary storage register means including portions for storing respective groups of encoded binary signals presently stored in respective ones of said portions of said present channel register in response to a first timing pulse;

said transmission means sequentially applying groups of encoded binary signals presently stored in each one of its said portions of said saved channel register means to said decoder means in response to at least respective second and third timing pulses generated after said first timing pulse;

said portions of saved channel register means storing respective groups of encoded binary signals presently stored in respective ones of said portions of said temporary storage register in response to a fourth timing pulse generated after said second and third timing pulses.

4. The apparatus recited in claim 1 wherein:

said binary signals stored in said channel register means represent the channel number of a presently selected channel;

said binary signals stored in said saved channel register means represent the channel number of a previously selected channel.

5. The apparatus recited in claim 4 wherein:

said channel selection means includes input means for causing the contents of said present channel register means to sequentially change in at least one predetermined sense when operated by a user.

6. The apparatus recited in claim 4 further including:

channel number display means coupled to said saved channel register means for displaying the channel number represented by the contents of said saved channel register means.

* * * * *